(12) United States Patent
Kajiyama et al.

(10) Patent No.: US 8,748,326 B2
(45) Date of Patent: Jun. 10, 2014

(54) DEVICE AND METHOD FOR FORMING LOW-TEMPERATURE POLYSILICON FILM

(75) Inventors: Koichi Kajiyama, Kanagawa (JP); Kuniyuki Hamano, Kanagawa (JP); Michinobu Mizumura, Kanagawa (JP)

(73) Assignee: V Technology Co., Ltd., Yokohama-Shi, Kanagawa (JP)

( * ) Notice: Subject to any disclaimer, the term of this patent is extended or adjusted under 35 U.S.C. 154(b) by 3 days.

(21) Appl. No.: 13/505,721

(22) PCT Filed: Oct. 14, 2010

(86) PCT No.: PCT/JP2010/068005
§ 371 (c)(1),
(2), (4) Date: May 2, 2012

(87) PCT Pub. No.: WO2011/055618
PCT Pub. Date: May 12, 2011

(65) Prior Publication Data
US 2012/0220140 A1  Aug. 30, 2012

(30) Foreign Application Priority Data
Nov. 5, 2009  (JP) ................................. 2009-254216

(51) Int. Cl.
| | | |
|---|---|---|
| *H01L 21/00* | (2006.01) | |
| *C30B 1/02* | (2006.01) | |
| *C30B 13/22* | (2006.01) | |
| *C30B 29/06* | (2006.01) | |
| *G03F 1/00* | (2012.01) | |

(52) U.S. Cl.
CPC ................. *C30B 1/023* (2013.01); *C30B 13/22* (2013.01); *C30B 29/06* (2013.01); *G03F 1/14* (2013.01)
USPC ............................ 438/795; 438/308; 438/378

(58) Field of Classification Search
USPC ......................... 438/795, 308, 378; 250/492.2
See application file for complete search history.

(56) References Cited

U.S. PATENT DOCUMENTS 7,829,245 B2    11/2010   Chung et al.
2005/0139788 A1*  6/2005  You ......................... 250/492.22
(Continued)

FOREIGN PATENT DOCUMENTS

| JP | 05-063196 | 3/1993 |
|---|---|---|
| JP | 2003-109911 A | 4/2003 |
| JP | 2003-203874 A | 7/2003 |
| JP | 2006-511064 A | 3/2006 |

(Continued)

OTHER PUBLICATIONS

International Search Report in PCT/JP2010/068005 dated Nov. 16, 2010(English Translation Thereof).

*Primary Examiner* — Charles Garber
*Assistant Examiner* — Brigitte Paterson
(74) *Attorney, Agent, or Firm* — McGinn IP Law Group, PLLC (57) ABSTRACT

Provided is a forming device and method making it possible to obtain a low-temperature polysilicon film in which the size of crystal grains fluctuates minimally, and is uniform. A mask has laser-light-blocking areas and laser-light-transmission areas arranged in the form of a grid such that the light-blocking areas and transmission areas are not adjacent to one another. Laser light is directed by the microlenses through the masks to planned channel-area-formation areas. The laser light transmitted by the transmission areas is directed onto an a-Si:H film, annealing and polycrystallizing the irradiated parts thereof. The mask is then removed, and when the entire planned channel-area-formation area is irradiated with laser light, the already-polycrystallized area, having a higher melting point, does not melt, while the area in an amorphous state melts and solidifies, leading to polycrystallization. The grain size of the polysilicon film obtained is regulated by the light-blocking areas and transmission areas and is thus controlled to a predetermined range.

3 Claims, 4 Drawing Sheets

(56) References Cited

U.S. PATENT DOCUMENTS

| | | |
|---|---|---|
| 2005/0202654 A1 | 9/2005 | Im |
| 2006/0186415 A1* | 8/2006 | Asano .............................. 257/72 |
| 2007/0032050 A1 | 2/2007 | Chung et al. |
| 2007/0148924 A1* | 6/2007 | Park .............................. 438/486 |
| 2008/0057731 A1* | 3/2008 | Uehara et al. ................. 438/756 |
| 2011/0117731 A1* | 5/2011 | Park et al. .................... 438/487 |

FOREIGN PATENT DOCUMENTS

| | | |
|---|---|---|
| JP | 2006-287129 A | 10/2006 |
| JP | 2007-043127 A | 2/2007 |
| JP | 2008-131024 A | 6/2008 |
| JP | 2008-521247 A | 6/2008 |
| WO | WO2004/017379 A2 | 2/2004 |
| WO | WO2006/055003 A1 | 5/2006 |

* cited by examiner

DEVICE AND METHOD FOR FORMING LOW-TEMPERATURE POLYSILICON FILM

CROSS-REFERENCE TO RELATED APPLICATIONS

This application is a national stage filing under Section 371 of International Application PCT/JP2010/068005 filed on Oct. 14, 2010, the entire contents of which are incorporated herein by reference.

TECHNICAL FIELD

The present invention relates to a device and method for forming a low-temperature polysilicon film in which an amorphous silicon film ("a-Si film") is irradiated with and annealed by laser light, whereby the a-Si is crystallized to polycrystalline silicon ("polysilicon").

BACKGROUND ART

An example of a thin film transistor of a reverse stagger construction is an amorphous silicon transistor. Such transistors are obtained by forming a gate electrode on an insulated substrate from a metallic layer made of Cr, Al, or the like; forming, e.g., a SiN film as a gate insulation film on the substrate including the gate electrode; subsequently forming a hydrogenated amorphous silicon ("a-Si:H") film over the entire surface; patterning the a-Si:H film in island shapes in predetermined areas on the gate electrode; and forming source and drain electrodes from the metal layer.

However, since such amorphous silicon transistors have an a-Si:H film in the channel area, a drawback is presented in that the mobility of charges in the channel area is low. Therefore, although amorphous silicon transistors can be used as pixel transistors in the pixel part of a liquid crystal display device, they are difficult to use as drive transistors in peripheral drive circuits that require high speed overwriting because the mobility of charges in the channel area is low.

On the other hand, forming of a polycrystalline silicon film directly on a substrate requires using low-pressure chemical vapor deposition (LPCVD), but this method is a high-temperature process performed at approximately 1500° C. and hence cannot be used for direct forming of a polycrystalline silicon film on a glass substrate (softening point: 400 to 500° C.) such as that used in a liquid crystal display device.

In view whereof, a low-temperature polysilicon process has been adopted in which an a-Si:H film is crystallized to a polysilicon film by a very fast phase transition from the solid to liquid phase and the liquid to solid phase. This is achieved by first forming a-Si:H film in the channel area, and then irradiating the a-Si:H film with laser light from a YAG excimer laser or the like to anneal the film. A transistor can thereby be formed on the glass substrate using a polysilicon film in which the mobility of charges in the channel area is high and the speed of transistor operation can be increased (Patent Reference 1).

PRIOR ART REFERENCES

Patent References

Patent reference 1: Japanese Provisional Publication No. hei 5-63196

DISCLOSURE OF THE INVENTION

Problems the Invention is Intended to Solve

However, with the method for forming a low-temperature polysilicon film described above, localized variations in the properties of polysilicon film formed by laser annealing constitute a problem that impedes practical realization. Such localized variations in the properties of low-temperature polysilicon films may give rise to display irregularities on the screen of a liquid crystal display device.

One cause of local variations in the characteristics of a-Si films is that local variations occur in the size of the crystallized Si crystal grains, and electrical conductivity within the polysilicon film varies according to the density or state of the crystal grain boundaries, so that the electrical conductivity of the polysilicon film varies as a whole. For this reason, practical realization of a low-temperature polysilicon film will require that the crystal grain size of the polysilicon film formed by annealing through irradiation with, for example, a YAG excimer laser light, be controlled to within a given range.

Possible methods for controlling crystal grain size include adjusting the excimer laser light irradiation conditions, specifically, adjusting the laser energy, the pulse width, the substrate temperature, and other attributes. However, in the case of melting and solidification within a very short time interval through laser irradiation, the rate of crystallization is roughly 10 orders of magnitude faster than normal rate of crystallization, and because of this extremely rapid rate of crystallization, the grain size is difficult to control. In particular, determining laser irradiation conditions suitable for controlling the crystal grain size to within a predetermined range having an upper limit and lower limit is more difficult than with a case of determining only laser irradiation conditions merely suitable for the purpose of controlling the grain size to no more than a maximum value, or laser irradiation conditions suitable for the purpose of controlling grain size to at least a minimum value. In particular, if the a-Si film thickness or Si density of the film varies, grain size will vary even under identical annealing conditions; therefore, it is necessary to verify the film quality prior to setting the annealing conditions, making the procedure for setting the annealing conditions extremely complex.

With the foregoing problems in view, it is an object of the present invention to provide a device and method for forming a low-temperature polysilicon film, whereby a low-temperature polysilicon film having the highest possible uniformity of crystal grain size can be obtained, with negligible variation in crystal grain size.

Means for Solving the Problems

A low-temperature silicon film forming device according to a first aspect of the present invention comprises: a plurality of microlenses arranged one-dimensionally or two-dimensionally; a laser-light-generating source; a light guide section for guiding laser light from the laser-light-generating source to the microlenses so as to condense the laser light onto an amorphous silicon film by the microlenses; and a plurality of masks arranged for each of the microlenses; wherein a plurality of transmission areas for transmitting the laser light and a plurality of light-blocking areas for blocking the laser light are in a two-dimensional arrangement on the masks, and are disposed alternatingly in one direction, such that the transmission areas are not adjacent to one another and the light-blocking areas are not adjacent to one another.

In the device for forming a low-temperature polysilicon film, for example, the transmission areas and the light-blocking areas are rectangular; and the transmission areas and light-blocking areas of the masks are arranged in the form of a grid.

A device for forming a low-temperature polysilicon film according to a second aspect of the present invention comprises: a plurality of microlenses arranged one-dimensionally or two-dimensionally; a laser-light-generating source; a light guide section for guiding laser light from the laser-light-generating source to the microlenses so as to condense the laser light onto an amorphous silicon film by the microlenses; and a plurality of masks arranged for each of the microlenses; wherein the masks are formed in an arrangement such that a plurality of spot-shaped transmission areas for transmitting the laser light is two-dimensionally interspersed within a light-blocking area for blocking the laser light.

A device for forming a low-temperature polysilicon film according to a third aspect of the present invention comprises: a plurality of microlenses arranged one-dimensionally or two-dimensionally; a laser-light-generating source; a light guide section for guiding laser light from the laser-light-generating source to the microlenses so as to condense the laser light onto an amorphous silicon film by the microlenses; and a plurality of masks arranged for each of the microlenses; wherein a plurality of transmission areas for transmitting the laser light is two-dimensionally arranged on the masks, and the transmission areas are partitioned by a light-blocking area for blocking the laser light.

A device for forming a low-temperature polysilicon film according to a fourth aspect of the present invention comprises: a plurality of microlenses arranged one-dimensionally or two-dimensionally; a laser-light-generating source; a light guide section for guiding laser light from the laser-light-generating source to the microlenses so as to condense the laser light onto an amorphous silicon film by the microlenses; and a plurality of masks arranged for each of the microlenses; wherein the masks are supported so that a plurality of spot-shaped light-blocking areas for blocking the laser light is arranged two-dimensionally with respect to a transmission member for transmitting the laser light.

In the devices for forming a low-temperature polysilicon film of the first through fourth aspects of the present invention, for example, the microlenses are provided for individual transistors to be formed.

A low-temperature polysilicon film forming method according to the present invention, using any of the above first through third aspects of the devices for forming a low-temperature polysilicon film, comprises the steps of a first directing laser light onto an amorphous silicon film via the masks using the microlenses; and a subsequent second directing laser light onto the amorphous silicon film using the microlenses, but without using the masks.

The low-temperature polysilicon film forming method may be configured so that, for example, the conditions under which the laser light is emitted by the laser light source in the first step and in the second step are the same.

Low-temperature polysilicon film forming method according to another aspect of the present invention, using the above fourth aspect of the device for forming a low-temperature polysilicon film, comprises a step of directing laser light onto an amorphous silicon film via the masks using the microlenses.

According to the present invention, in a case in which the first low-temperature polysilicon film forming device is used, in a first step, the amorphous silicon film (a-Si film) is irradiated only by laser light transmitted by the transmission areas of the masks; and only those portions in the a-Si film corresponding to these transmission areas are annealed, undergo melting and solidification, and crystallize to polysilicon. At this time, the crystal grain size of the polysilicon portions is regulated in correspondence with the transmission areas of the masks, and does not increase beyond the transmission areas; therefore, deviations in the crystal grain size are small. Moreover, portions corresponding to the light-blocking areas of the masks remain amorphous. Thereafter, in a second step, the entire a-Si film, including the portions that were polycrystallized in the first step, is irradiated with laser light. In so doing, the polysilicon portions, owing to their high melting point, do not melt, so that only the remaining amorphous portions (the portions corresponding to light-blocking areas) undergo melting and solidification, and polycrystallize. In these newly polycrystallized portions as well, the crystal grains do not grow to a size equal to or greater than that of the light-blocking areas, and deviations in the crystal grain size are small.

In a case in which the second low-temperature silicon film forming device of the present invention is used, in a first step, an a-Si film is irradiated by laser light transmitted only by the transmission areas of the masks; and only those portions in the a-Si film corresponding to these transmission areas are annealed, undergo melting and solidification, and crystallize to polysilicon. In so doing, polysilicon portions are produced dispersedly in spot form within the a-Si film. Next, when the entirety of the film is irradiated with laser light in the second step, the small polysilicon portions present in the a-Si film serve as seeds, and the entire a-Si film undergoes polycrystallization. At this time, because the polysilicon film grows from seeds of polysilicon portions which have formed as interspersed spots, the size of the crystal grains is controlled to within a fixed narrow range, without the crystal grains increasing in size.

In a case in which the third low-temperature polysilicon film forming device of the present invention is used, in a first step, the amorphous silicon film (a-Si film) is irradiated only by laser light transmitted by the transmission areas of the masks; and only those portions in the a-Si film corresponding to these transmission areas are annealed, undergo melting and solidification, and crystallize to polysilicon, as with the case in which the first low-temperature silicon film forming device is used. At this time, the crystal grain size of the polysilicon portions is regulated in correspondence with the transmission areas of the masks, and does not increase beyond the transmission areas; therefore, deviations in the crystal grain size are small. Moreover, portions corresponding to the light-blocking areas of the masks remain amorphous. Thereafter, in the second step, the entire a-Si film, including the portions that were polycrystallized in the first step, is irradiated with laser light. In so doing, the polysilicon portions, owing to their high melting point, do not melt, so that only the remaining amorphous portions (the portions corresponding to light-blocking areas) undergo melting and solidification, and polycrystallize. In these newly polycrystallized portions as well, the crystal grains do not grow to a size equal to or greater than that of the light-blocking areas, and deviations in the crystal grain size are small.

In a case in which the fourth low-temperature silicon film forming device of the present invention is used, a plurality of spot-shaped light-blocking areas is disposed two-dimensionally while being supported by a transmission member; therefore, the amorphous silicon film is irradiated by the laser light that has been transmitted through those portions of the transmission member devoid of light-blocking areas to bring about heating and melting of these portions. However, the portions of the amorphous silicon film corresponding to these light-blocking areas are not irradiated by the laser light, but are heated only by heat conduction from the irradiated areas, and accordingly are at a lower temperature than the irradiated areas. Thus, since the temperature is different between the laser-irradiated areas and the non-laser-irradiated areas, crystallization proceeds from the non-irradiated areas during solidification, and then from the irradiated areas. Accordingly, the crystal grains do not increase in size.

Effects of the Invention

According to the present invention, in cases in which the first to third devices for forming a low-temperature polysilicon film are used, polycrystallizing of the a-Si film in an area thereof being processed occurs in two steps, namely, irradiation with laser light using masks, and irradiation with laser light without using masks. This prevents the crystal grains from increasing in size over the course of polycrystallization, and makes it possible to obtain a low-temperature polysilicon film in which crystal grain size is controlled to within a given range. In a case in which the fourth device for forming a low-temperature polysilicon film is used, portions of the a-Si film irradiated by the laser light passing through the transmission member are heated to high temperature and melt, whereas the portions prevented by the spot-shaped light-blocking areas from being irradiated by the laser light are heated by conduction of heat from the irradiated areas, and while melting, do so at a lower temperature than the irradiated area, with crystallization taking place from these low-temperature portions. The size of the crystal grains can be prevented from increasing, and a low-temperature polysilicon film in which crystal grain size is controlled to within a given range can be obtained.

BRIEF DESCRIPTION OF THE DRAWINGS

FIG. 6(a) is a cross-sectional view showing a mask of a device for forming a low-temperature polysilicon film according to Embodiment 4 of the present invention; and (b) is a plan view of same.

BEST MODE FOR CARRYING OUT THE INVENTION

Figure 1:
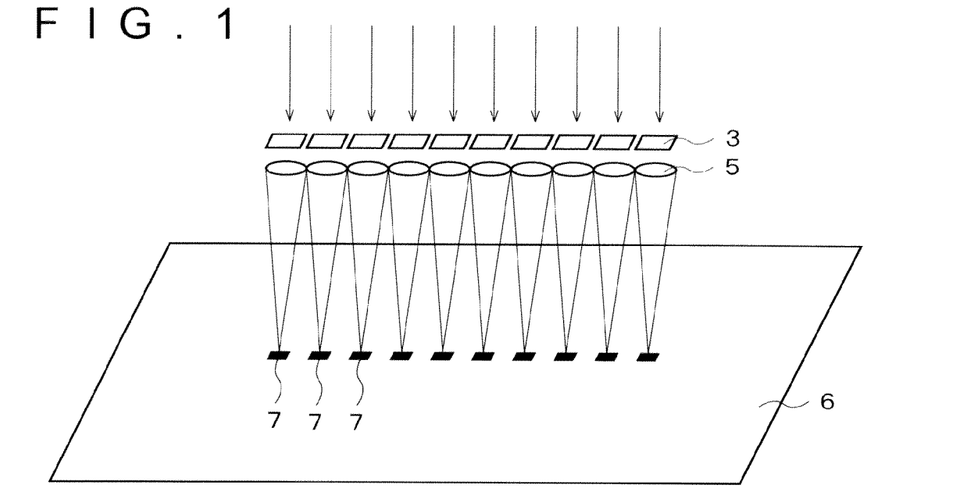
FIG. 1 is a schematic perspective view showing a device for forming a low-temperature polysilicon film according to Embodiment 1 of the present invention.
Figure 2:
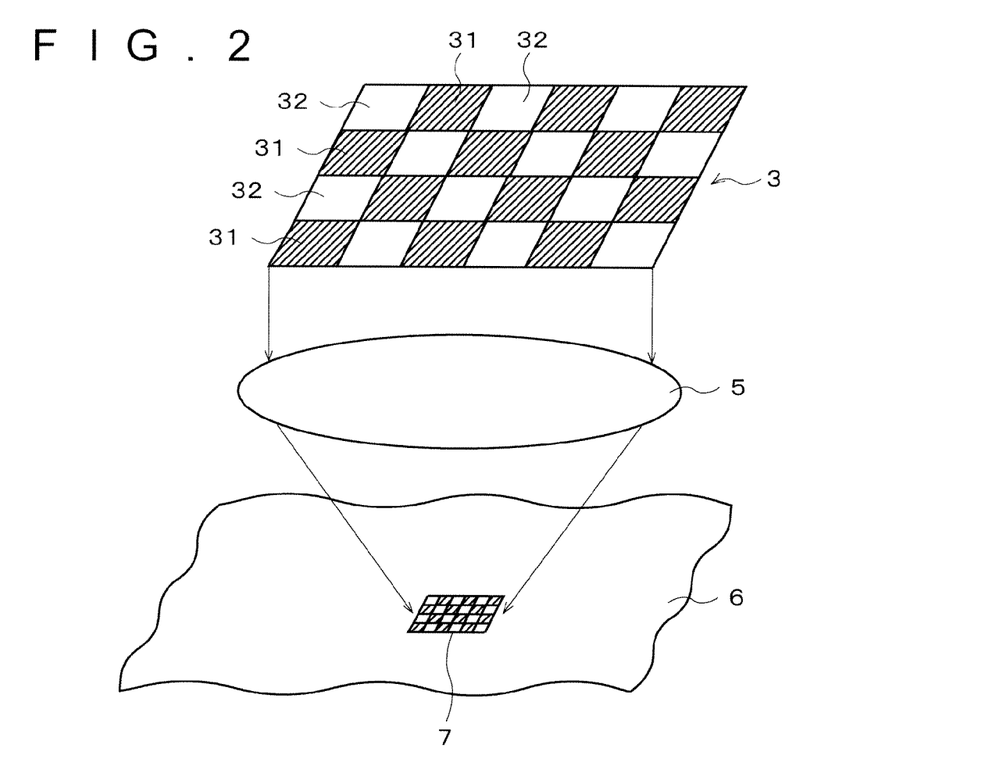
FIG. 2 is a schematic enlarged perspective view showing one microlens and a corresponding mask in Embodiment 1.
Figure 3:
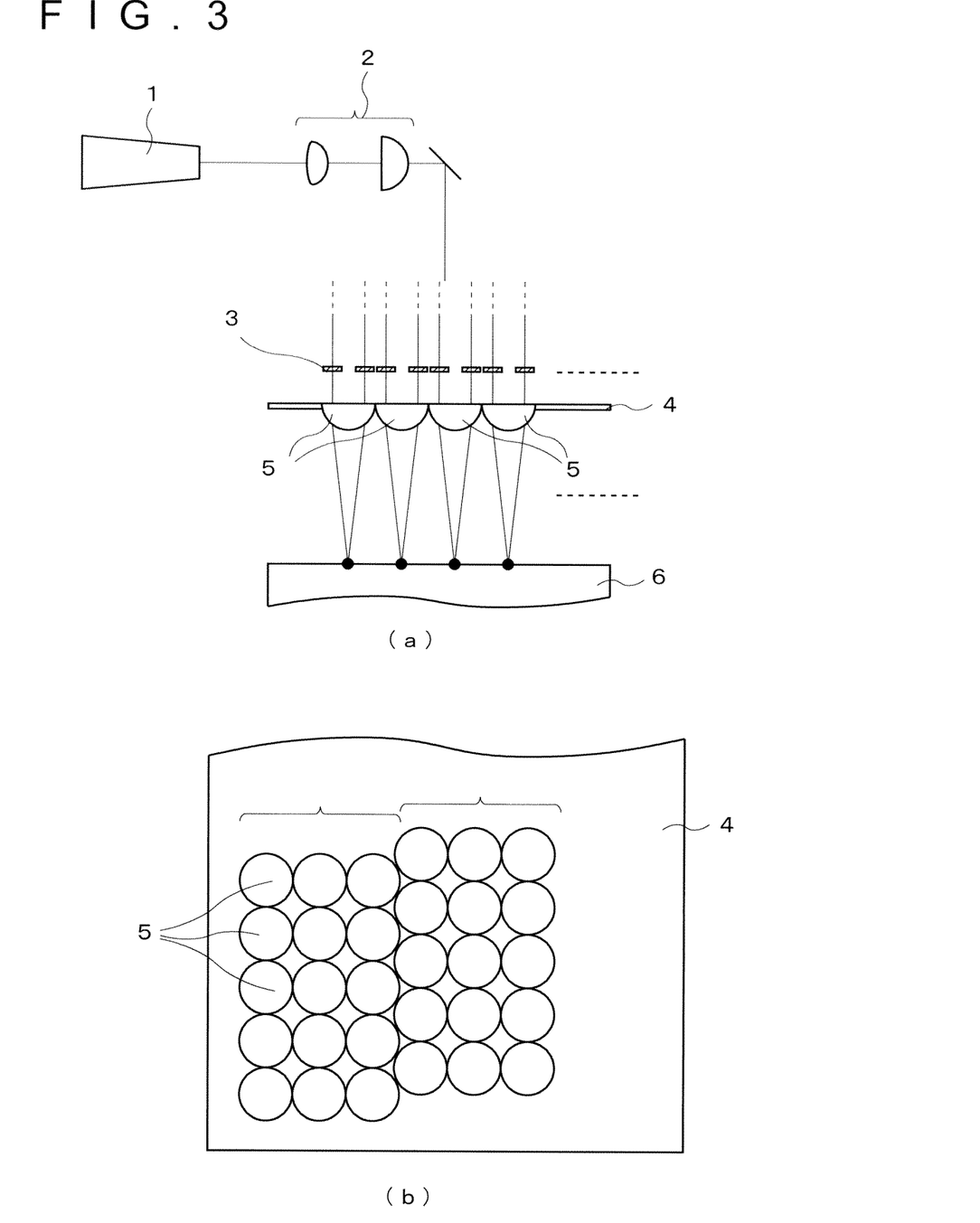
FIG. 3 is a diagram showing a laser irradiation device that uses microlenses.

Embodiments of the present invention are described in detail below with reference to the accompanying drawings. FIG. 1 is a schematic perspective view showing a device for forming a low-temperature polysilicon film according to an embodiment of the present invention. FIG. 2 is a schematic expanded perspective view showing one microlens and a corresponding mask. FIG. 3 shows a laser irradiation device in which a microlens is used. The laser irradiation device shown in FIG. 3 is a device used, in a step for producing a semiconductor device such as a thin film transistor having a reverse staggered structure, for, e.g., directing laser light on and annealing only the planned channel-area-formation areas, polycrystallizing the planned channel-area-formation areas, and forming a polysilicon film. In this microlens-equipped laser annealing device, laser light emitted from a light source 1 is formed into parallel beams through a lens group 2, and directed on an object of irradiation 6 via a microlens array comprising a plurality of microlenses 5. The laser light source 1 is, for example, an excimer laser that radiates laser light having a wavelength of 308 nm or 353 nm at a repetition cycle of 50 Hz. The microlens array has a plurality of microlenses 5 arranged on a transparent substrate 4, the laser light being condensed on an area set where thin-film transistors are to be formed on a thin-film transistor substrate constituting the object of irradiation 6. The transparent substrate 4 is arranged in parallel with the object of irradiation 6 and the microlenses 5 are arranged at a pitch that exceeds, by a factor of 2 or a larger integer (e.g., 2), the pitch at which the planned transistor-formation areas are arranged. The object of irradiation 6 of the present embodiment is, for example, a thin film transistor; laser light is directed on planned channel-area-formation areas of the a-Si film, and polysilicon channel areas are formed.

For example, in a case in which a transistor for driving pixels is formed as a peripheral circuit of a liquid crystal display device, a gate electrode comprising a metal film made of Al or the like is patterned on a glass substrate by sputtering. Using silane or $H_2$ gas as a feedstock gas, a gate insulation film comprising a SiN film is formed over the entire surface using low-temperature plasma CVD performed at 250 to 300° C. Thereafter, for example, plasma CVD is used to form an a-Si:H film on the gate insulation film. The a-Si:H film is formed using a gas mixture of silane and $H_2$ gas as a feedstock gas. Taking the areas of the a-Si:H film on the gate electrode as the planned channel-formation areas, one microlens 5 is arranged for each of the channel areas. Only the planned channel-formation areas are irradiated by the laser light and annealed. The planned channel-formation areas are polycrystallized, and polysilicon channel areas are formed. Although not shown in FIG. 3, light-blocking members used so that laser light will only be directed on the planned channel-formation areas is arranged above the microlenses 5, and the channel area is defined by this light-blocking member. The microlenses 5 are only shown in a one-dimensional arrangement in FIG. 3(a) and FIG. 1, but only for purposes of simplification. As shown in the plan view of FIG. 3(b), the microlenses 5 are actually arranged two-dimensionally; however, the microlenses 5 can be arranged one-dimensionally to match the arrangement of the area to be polycrystallized.

Furthermore, in the present embodiment, as shown in FIG. 1, FIG. 2, and FIG. 3(a), one mask 3 for each of the microlenses 5 is provided above the microlenses 5. The masks 3 are, for example, rectangular in overall shape; and are subdivided into small, rectangular grid-shaped areas. Light-blocking areas 31 for blocking laser light and transmission areas 32 for transmitting laser light are arranged as a grid so that light-blocking areas 31 and transmission areas 32 are not adjacent to one other. Laser light is directed on the object of irradiation 6 through the microlenses 5 via the masks 3, whereby areas irradiated with laser light are formed on the a-Si:H film correspondingly with respect to planned channel-area-formation areas 7. The laser light irradiation pattern in the planned area 7 corresponds to the pattern of the transmission areas 32 of the mask 3.

There shall now be described a method for forming a low-temperature polysilicon film using the forming device constructed as described above. First, in step 1, laser light is directed on the object of irradiation 6 using the mask 3. After passing through the mask 3, the parallel beams of laser light are condensed by the microlenses 5 and directed on the planned channel-formation areas 7 on the a-Si:H film constituting the object of irradiation 6. The laser light gets blocked by the light-blocking areas 31 of the mask 3; only the portion transmitted by the transmission areas 32 is directed on the planned areas 7, and a laser light irradiation area is formed in the same grid pattern as the mask 3. In the planned areas 7, only the portion that has been irradiated with laser light melts, solidifies, crystallizes, and undergoes a phase change to polysilicon. This polysilicon part is a part where the transmission areas 32 of the mask 3 have been reduction-projected by the microlenses 5. Since it is only this reduction-projected part that gets irradiated by the laser light, the polycrystallized polysilicon crystals do not grow in size beyond the reduction-projected part. Accordingly, the polysilicon part is regulated by the size of the area onto which the transmission area 32 is reduction-projected, and the size of the grains therein is regulated and controlled to a fixed narrow range.

Next, in step 2, the mask 3 is removed, and laser light is then directed onto the object of irradiation 6, whereby the laser light is directed onto the entirety of the planned channel-area-formation area 7. Since the melting point of the polysilicon part will then be higher than that of the amorphous silicon part, the part that was crystallized in step 1 will not re-melt. Since the part of the a-Si:H film corresponding to the light-blocking area 31 of the mask 3 remains in an amorphous state in step 1, this amorphous part melts, solidifies, and polycrystallizes due to being irradiated by the laser light in step 2. The part polycrystallized in step 2 is the part of the a-Si:H film reduction-projected by the light-blocking area 31. Therefore, the crystal grains in the polysilicon part polycrystallized in step 2 will not grow larger than the part reduction-projected by the light-blocking area 31. Consequently, the polysilicon part formed in step 2 is regulated by the size of the area reduction-projected by the light-blocking area 31, and the size of the crystal grains therein will be controlled to within a fixed narrow range.

A polysilicon film having a crystal grain size controlled to within a fixed narrow range is thus formed in the planned channel-area-formation area 7. Therefore, transistors having the polysilicon film used in the channel areas will be capable of high-speed operation, and the crystal grains in the polysilicon channel areas will be of uniform size, making it possible to obtain a semiconductor device having stable transistor characteristics.

In Embodiment 1, the light-blocking areas 31 and transmission areas 32 of the mask 3 are not limited to being of rectangular shape; they can be circular or any of a variety of other shapes. Furthermore, the approach adopted in the embodiment described above was that no mask be used in step 2 besides the light-blocking areas for defining the channel areas, but it is possible to use a mask in step 2 as well, and make the parts used as light-blocking areas in step 1 into transmission areas, and the parts used as transmission areas in step 1 into light-blocking areas. The laser light is directed only on the parts of the a-Si:H film that remain amorphous in step 1, and these parts are annealed. Furthermore, in such an instance, it is permissible to make the transmission areas in step 2 smaller than the light-blocking areas of step 1, and provide a gap between the laser light irradiation areas in step 1 and the laser light irradiation areas in step 2. This will make it possible to prevent crystal growth from originating at the polysilicon part already polycrystallized in step 1 when the amorphous area polycrystallizes in step 2. The polysilicon can thereby be allowed to grow in step 2 without being affected by the crystal grain morphology in the polysilicon in step 1.

Figure 4:
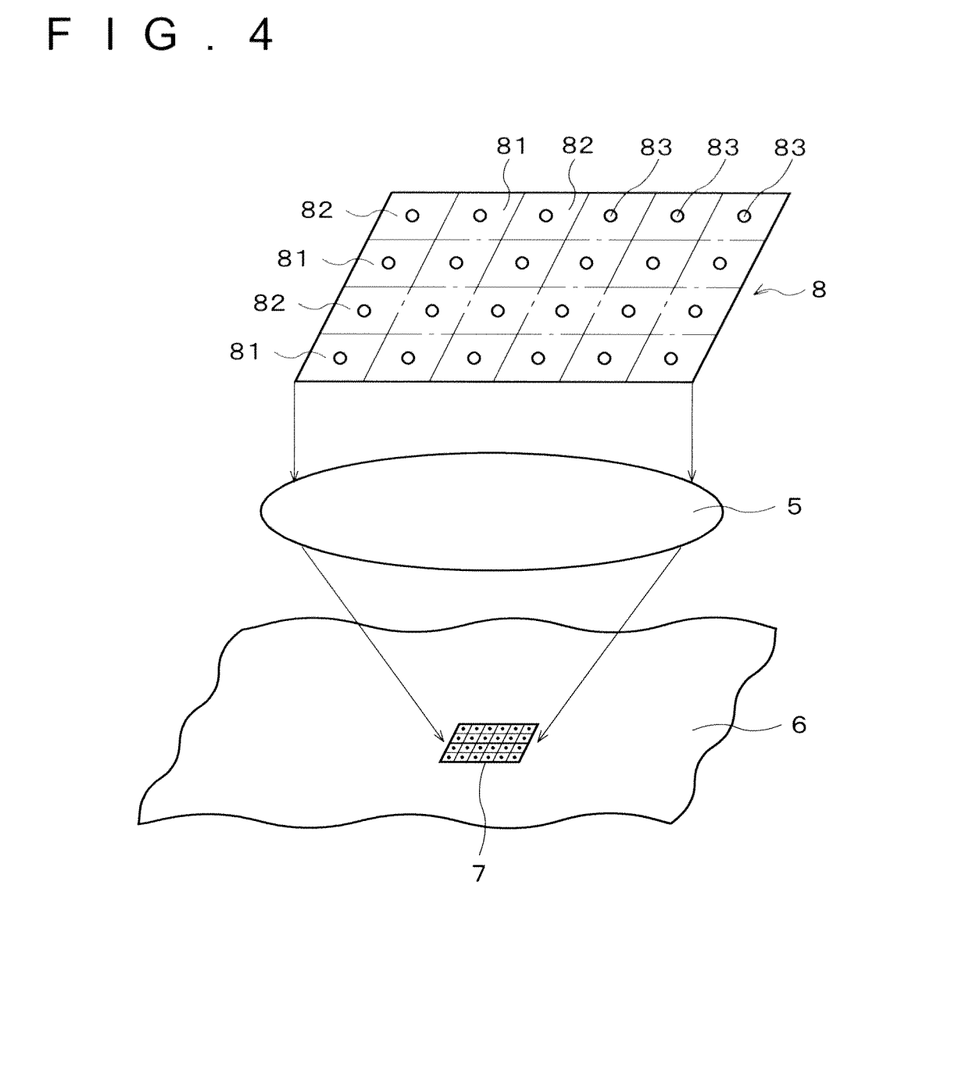
FIG. 4 is a schematic perspective view showing a device for forming a low-temperature polysilicon film according to Embodiment 2 of the present invention.

Embodiment 2 of the present invention will now be described with reference to FIG. 4. The present embodiment differs from Embodiment 1 only in regard to the structure of the mask 8. The entire surface of the mask 8 comprises light-blocking areas; e.g., circular transmission areas 83 are formed in these light-blocking areas in an interspersed arrangement. For example, the mask 8 can be assumed to have a plurality of rectangular areas 81, 82. In other words, conceptually, the mask 8 has a plurality of areas 81, 82, one transmission area 83 being arranged in each of the areas 81, 82. Therefore, when the mask 8 is used and laser light is directed on the object of irradiation 6 using the microlenses 5, the parts irradiated by the laser light will be arranged in the form of equidistant spots on the planned channel-area-formation area 7 of the object of irradiation 6.

There shall now be described a method for forming a low-temperature polysilicon film using the forming device of Embodiment 2. First, in step 1, laser light is directed, using the microlenses 5, on the planned channel-area-formation areas 7 of the object of irradiation 6, using the mask 8. An irradiation pattern where areas irradiated by the laser light in a spot-shaped configuration are interspersed at equidistant intervals is obtained in the planned area 7. The areas where the laser light is directed in a spot-shaped configuration is where the a-Si:H film melts and solidifies to yield polycrystallized polysilicon.

Next, the mask 8 is removed and the entirety of the planned area 7 is irradiated with laser light. With the spot-shaped areas polycrystallized in step 1 serving as seeds, crystallization occurs and the entirety of the planned area 7 becomes a polysilicon film. In this case, the seeds for crystallization in the resulting polysilicon film are the already-polycrystallized parts of the parts corresponding to the transmission areas 83 for each of the reduction-projected areas of the areas 81, 82 in the area of the a-Si:H film reduction-projected by the mask 8. Therefore, at a minimum, the crystal grains will not grow larger than the reduction-projected areas of the areas 81, 82, and the size of the crystal grains in the resulting polysilicon film will be controlled to within a fixed narrow range. Therefore, the forming device of Embodiment 2 can be used to achieve the same effect as is achieved in Embodiment 1.

In the present embodiment, the entirety of the planned area 7 is irradiated with laser light in step 2. This is because recrystallized areas have a higher melting point, and accordingly remain as polycrystals without melting even if re-irradiated with laser light.

In the embodiments described above, the conditions under which the laser light is emitted; i.e., the conditions under which the a-Si:H film is heated, can be the same in step 1 and step 2. The size of the light-blocking areas 31 and transmission areas 32 of the mask 3 of Embodiment 1 as well as the spacing of the transmission areas 83 in the mask 8 of Embodiment 2 (i.e., the size of the conceptual areas 81, 82) may be such that the length on one side in the reduced-projection areas of the object of irradiation 6 is approximately 1 μm. This will allow the crystal grains of the polysilicon film to be brought to a uniform size of 1 μm or less. Since thin film transistors measure from 10 to 20 μm to several tens of microns on a side, if the size of the crystal grains in the channel polysilicon area is 1 μm or less, sufficiently stable transistor characteristics can be obtained. As described above, the areas 81, 82 of Embodiment 2 can be set to have a length of approximately 1 μm per side in the areas reduction-projected on the object of irradiation 6. In this case, the transmission areas 83 of the mask 8 can be set to have a diameter of, e.g., approximately 0.1 µm, in terms of the reduction-projected size on the object of irradiation 6.

Figure 5:
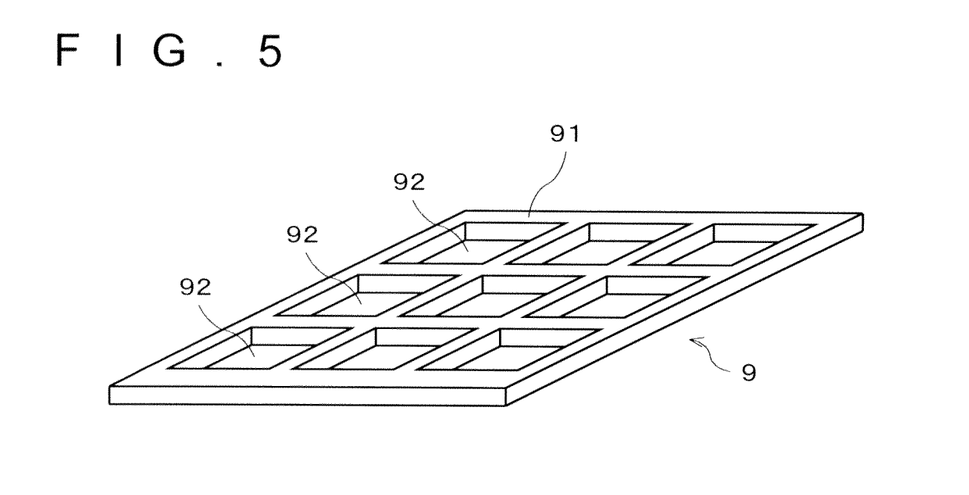
FIG. 5 is a schematic perspective view showing a mask of a device for forming a low-temperature polysilicon film according to Embodiment 3 of the present invention.

Embodiment 3 of the present invention will now be described with reference to FIG. 5. The mask 9 in FIG. 5 is configured by cutting out from a light-blocking member 91 a plurality of rectangular holes at a prescribed relative spacing, the light-blocking member 91 formed using a material that blocks laser light. A plurality of transmission areas 92 comprising the plurality of rectangular holes is arranged two-dimensionally. The transmission areas 92 are surrounded by light-blocking areas comprising the light-blocking member 91, and are partitioned by the light-blocking areas.

There shall now be described a method for forming a low-temperature polysilicon film using the forming device of Embodiment 3. First, in step 1, laser light is directed via the microlens 5 on the planned channel-area-formation area of the object of irradiation 6 using the mask 9. As with Embodiment 1, only the laser light that passes through the transmission areas 92 of the mask 9 is directed onto the amorphous silicon film (a-Si film). Only the part of the a-Si film corresponding to the transmission areas is annealed, melted, and solidified to crystallize into polysilicon. The grain size of the polysilicon part is regulated in accordance with each of the transmission areas 92 of the mask, and, at a minimum, no single crystal grain will grow larger than a single transmission area 92. Variation in grain size is accordingly minimized. Furthermore, the part corresponding to the light-blocking area (light-blocking member 91) of the mask remains amorphous.

The mask 9 is then removed and the entire planned channel-area-formation area is irradiated with laser light. With the spot-shaped areas polycrystallized in step 1 serving as seeds, crystallization occurs and the entire planned area becomes a polysilicon film. In this case, the seeds for crystallization in the resulting polysilicon film are the already-polycrystallized parts of the parts corresponding to the transmission areas 92 for each of the reduction-projected areas of the transmission areas 92 in the area of the a-Si:H film reduction-projected by the mask 9. Therefore, at a minimum, the crystal grains will not grow larger than the reduction-projected areas of the transmission areas 92, and the size of the crystal grains in the resulting polysilicon film will be controlled to within a fixed narrow range. Therefore, the forming device of Embodiment 3 can be used to achieve the same effect as is achieved in Embodiment 1.

In the present embodiment, the entire planned area is irradiated with laser light in step 2. This is because recrystallized areas have a higher melting point, and accordingly remain as polycrystals without melting even if re-irradiated with laser light.

Figure 6:
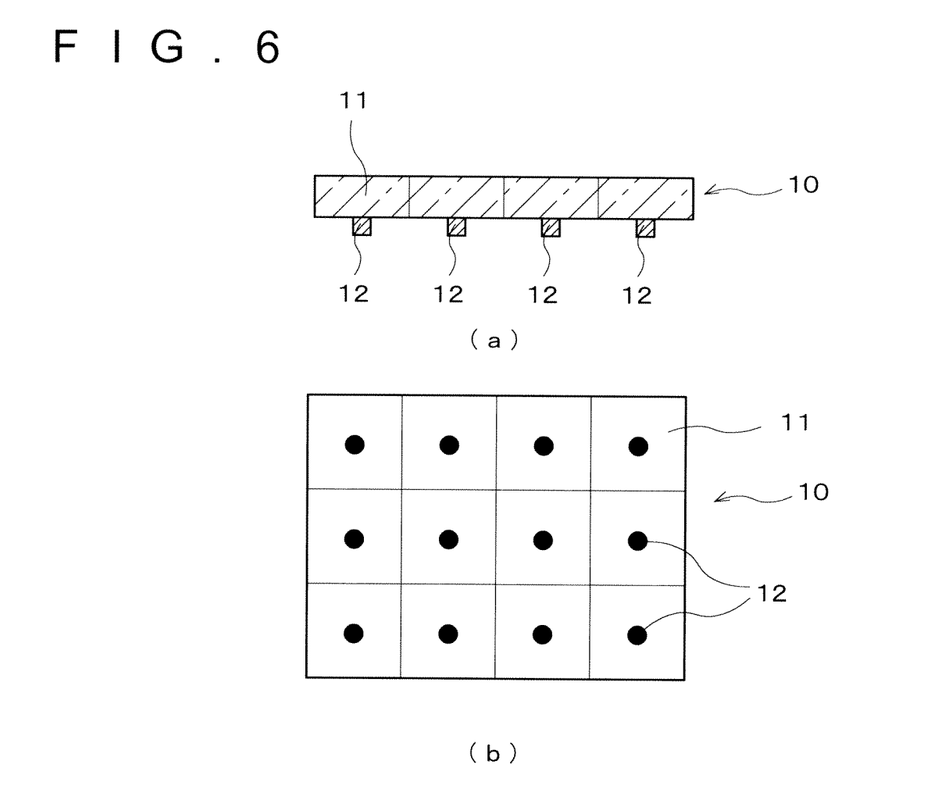

Embodiment 4 of the present invention will now be described with reference to FIGS. 6(a) and 6(b). In the low-temperature polysilicon forming device of the present embodiment, spot-shaped light-blocking areas 12 for blocking laser light are arranged two-dimensionally at fixed spacing on a bottom surface of a plate-shaped transmission member 11 through which the mask 8 transmits laser light. These light-blocking areas 12 are small and cylindrical laser-light-blocking members joiningly attached to the bottom surface of the transmission members 11. Thus, in the present embodiment, a plurality of spot-shaped light-blocking areas 12 is two-dimensionally arranged in a state of being supported on the transmission members 11.

There shall now be described a method for forming a low-temperature polysilicon film using the forming device of Embodiment 4. In this embodiment, the laser light irradiation step comprises a single step. When laser light is directed on the a-Si film through the mask 10, the a-Si film is irradiated with laser light that passes through parts of the transmission member 11 where no light-blocking areas 12 are present, and these parts of the film are heated and melted. However, the parts of the a-Si film corresponding to the light-blocking areas 12 are not irradiated by the laser light, but are merely heated by heat conduction from the irradiated areas; therefore, the temperature of those parts is lower than the irradiated areas. Thus, since the temperature is different between the laser-irradiated areas and the non-laser-irradiated areas, crystallization proceeds from the non-irradiated areas during solidification, and then from the irradiated areas. Accordingly, the crystal grains do not increase in size. In other words, with respect to the areas demarcated by the thin lines in FIG. 6(b), crystallization progresses from the parts corresponding to each of the light-blocking areas 12; therefore, the crystals in the resulting polysilicon film do not exceed the size of the area demarcated by these lines, and it is possible to obtain a polysilicon film of uniform grain size.

INDUSTRIAL APPLICABILITY

The present invention is useful for manufacturing semiconductor devices having stable transistor characteristics.

KEY

1: laser light source
3, 8, 9, 10: mask
5: microlens
6: object of irradiation
7: planned channel-area-formation area
11: transmission member
12: light-blocking area
31: light-blocking area
32: transmission area
81, 82: area
83: transmission area
91: light-blocking member
92: transmission area

The invention claimed is:
1. A device for forming a low-temperature polysilicon film comprising:
   a plurality of microlenses arranged one-dimensionally or two-dimensionally;
   a laser-light-generating source;
   a light guide section for guiding laser light from the laser-light-generating source to said microlenses so as to condense said laser light onto an amorphous silicon film by said microlenses; and
   a plurality of, masks, each of the masks being arranged for each of the microlenses, and each including a plurality of transmission areas for transmitting said laser light and a plurality of light-blocking areas for blocking said laser light in a two-dimensional arrangement on said masks,
   wherein said transmission areas and said light-blocking areas are disposed alternatingly in one direction and an other direction crossing said one direction, such that the transmission areas are not adjacent to one another and the light-blocking areas are not adjacent to one another, and
   wherein the masks are disposed between the light guide section and the microlenses.

2. A device for forming a low-temperature polysilicon film comprising:
- a plurality of microlenses arranged one-dimensionally or two-dimensionally;
- a laser-light-generating source;
- a light guide section for guiding laser light from the laser-light-generating source to said microlenses so as to condense said laser light onto an amorphous silicon film by said microlenses; and
- a plurality of masks, each of the masks being arranged for each of the microlenses, and each including a plurality of transmission areas for transmitting said laser light and a plurality of light-blocking areas for blocking said laser light in a two-dimensional arrangement on said masks,
- wherein said transmission areas and said light-blocking areas are disposed alternatingly in one direction and another direction crossing said one direction, such that the transmission areas are not adjacent to one another and the light-blocking areas are not adjacent to one another,
- wherein said microlenses are provided for individual transistors to be formed, and
- wherein the microlenses are arranged at a pitch that exceeds by a factor of two or more a pitch of the individual transistors to be formed.

3. A device for forming a low-temperature polysilicon film comprising:
- a plurality of microlenses arranged one-dimensionally or two-dimensionally;
- a laser-light-generating source;
- a light guide section for guiding laser light from the laser-light-generating generating source to said microlenses so as to condense said laser light onto an amorphous silicon film by said microlenses; and
- a plurality of masks, each of the masks being arranged for each of said microlenses, each of said masks including a light-blocking area for blocking said laser light and a plurality of spot-shaped transmission areas for transmitting said laser light being formed in an arrangement such that said spot-shaped transmission areas are two-dimensionally interspersed within said light-blocking area,
- wherein the masks are disposed between the light guide section and the microlenses.

\* \* \* \* \*